United States Patent [19]

Minakuchi

[11] Patent Number: 4,509,182
[45] Date of Patent: Apr. 2, 1985

[54] BINARY COUNTER

[75] Inventor: Hiroshi Minakuchi, Shiga, Japan

[73] Assignee: Matsushita Electric Industrial Co., Ltd., Kadoma, Japan

[21] Appl. No.: 384,173

[22] Filed: Jun. 2, 1982

[30] Foreign Application Priority Data

Jun. 4, 1981 [JP] Japan .................................. 56-86465
Aug. 13, 1981 [JP] Japan ................................ 56-127644
Nov. 16, 1981 [JP] Japan ................................ 56-183567

[51] Int. Cl.³ .................... H03K 23/08; H03K 21/06; H03K 21/10
[52] U.S. Cl. .................................. 377/116; 377/119; 377/120; 377/121; 307/299 B
[58] Field of Search ............... 377/115, 116, 118, 119, 377/120, 121; 307/299 B

[56] References Cited

U.S. PATENT DOCUMENTS 3,110,821 11/1963 Webb ................................... 377/116
3,772,536 11/1973 Grannis et al. ..................... 377/121
3,970,867 7/1976 Leuschner ........................... 377/116

FOREIGN PATENT DOCUMENTS 2326110 1/1974 Fed. Rep. of Germany ...... 377/116
2361779 3/1978 France .
799148 1/1981 U.S.S.R. .............................. 377/116

OTHER PUBLICATIONS

Electronics Letters, vol. 16, No. 9, Apr. 24, 1980, pp. 315, 316.
Wireless World, vol. 83, No. 1498, Jun. 1977, pp. 52-55.

Primary Examiner—John S. Heyman
Attorney, Agent, or Firm—Wenderoth, Lind & Ponack

[57] ABSTRACT

A binary counter consists of some unit stages having a first pair of coincident gates composed of a first and a second coincident gates, a first input terminal of each being cross-coupled with the other's output terminal, and a second pair of coincident gates composed of a third and a fourth coincident gates, a first input terminal of each being cross-coupled with the other's output terminal.

2 Claims, 14 Drawing Figures

⎍ DELAY PER GATE

⎍ DELAY PER COLLECTOR

BINARY COUNTER

This invention relates to a binary counter, and materializes the binary counter whose unit stage can be constructed with a smaller number of gates than has been required traditionally and which is capable of high-speed operation.

As is well known, the basic logic of a conventional counter (including a frequency divider) is characterized by the unit stage, which is composed of an edge trigger T-type flip-flop made up of connection of 6 NAND gates or 6 NOR gates. Since counters of this type play the key role in a variety of digital systems, particularly, digital LSIs, many attempts have been made recently to decrease the number of gates used in the T-type flip-flop constituting the unit stage of the counter. Especially, since analog circuits and digital circuits can be mounted together in $I^2L$·IC, the application to cameras, watches, and control circuits of micro-motors has been remarkable. It has been reported that the number of elements required to constitute a unit stage was successfully reduced to four, although, conventionally, six to eight elements had been required. (Note that the number of elements varies, depending on whether only $\frac{1}{2}$ frequency division is carried out or reset function is added.)

Such examples were published in "An $I^2L$ Watch Chip with Direct LED Drive" by P. A. Tucci and L. K. Russel (IEEE JOURNAL OF SOLID-STATE CIRCUITS, Vol. SC-11, No. 6 (1976), pp. 847–851) and in "Comparison of Various Binary Dividers in $I^2L$" by U. Ablassmeier (The same IEEE journal, Vol. SC-14, No. 3 (1979), pp. 657–660).

However, these 4-element flip-flops were not capable of providing inverted output, and required special construction that differed greatly from the conventional one. Furthermore, as shown in Table 1 of the latter dissertation, the 4-element flip-flop had a demerit in that applicable frequency limit was lowered remarkably due to its special configuration. These flip-flops were only applicable to ICs of $I^2L$ configuration.

This invention offers a binary counter which has a unit stage whose basic circuit is composed of four coincidence gates and an inverter for stage-to-stage connection, for the purpose of solving the following problems.

A binary counter of this invention is composed of a first pair of coincidence gates consisting of a first and a second coincidence gates, and a second pair of coincidence gates consisting of a third and a fourth coincidence gates; with its unit stage constructed so that an output signal of said first coincidence gate is applied to a second input terminal of said third coincidence gate, an output signal of said second coincidence gate is applied to a second input terminal of said fourth coincidence gate, the output signal of said second coincidence gate is applied to a second input terminals of said first and second coincidence gates, an output signal of said second pair of coincidence gates is applied to the second input terminals of said first and second coincidence gates, and trigger signal is applied to a third input terminals of said first and second coincidence gates; an output signal of said first pair of coincidence gates being fed to the next unit stage as a trigger signal, the number of logic gates constituting a unit stage can be reduced, which in turn makes great contributions to the miniaturization of IC chip size, curtailment of power dissipation, or raising the applicable frequency limit.

Accordingly, an object of the present invention is to provide a binary counter consisting of a small number of gates, thereby reducing IC chip size and power dissipation.

Another object of the present invention is to provide a binary counter having higher limit of applicable frequency.

These and other objects, features and advantages of the present invention will become fully apparant hereinafter from the following detailed description taken in connection with the accompanying drawings in which:

Figure 1:
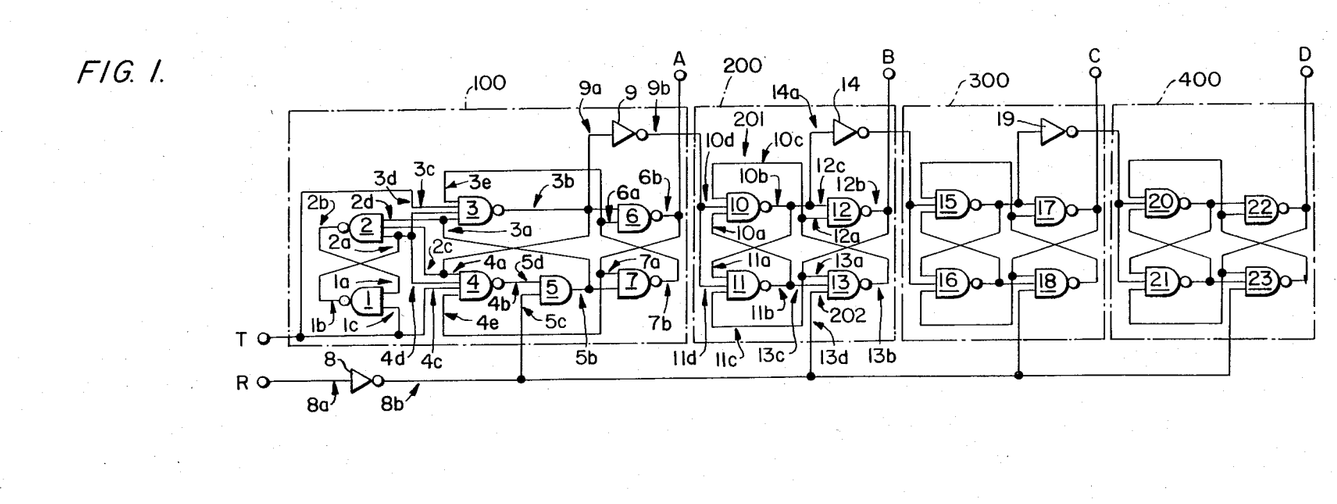
FIG. 1 is a logic diagram of an embodiment of a binary counter of the invention.

FIG. 1 shows a logic diagram of a binary counter equipped with reset function. In FIG. 1, a first input terminal 1a and an output terminal 1b of a NAND gate 1, and a first input terminal 2a and an output terminal 2b of a NAND gate 2, are cross-coupled; a first input terminal 3a and an output terminal 3b of a NAND gate 3 and a first input terminal 4a of a NAND gate 4 and an output terminal 5b of an AND gate 5 are cross-coupled; a first input terminal 6a and an output terminal 6b of a NAND gate 6 and a first input terminal 7a and an output terminal 7b of a NAND gate 7 and cross-coupled; and said output terminal 4b of said NAND gate 4 is connected with said input terminal 5a of said AND gate 5.

Second input terminals 1c, 3c, and 4c of said NAND gates 1, 3 and 4, respectively, are connected with a trigger signal input terminal T; a second and a third input terminals 2c and 2d of said NAND gate 2 are connected with the output terminal 3b of said NAND gate 3 and the output terminal 5b of said AND gate 5, respectively; third input terminals 3d and 4d of said NAND gates 3 and 4, respectively, are connected with the output terminal 1b of said NAND gate 1; and fourth input terminals 3e and 4e of said NAND gates 3 and 4, respectively, are connected with the output terminals 7b and 6b of said NAND gates 7 and 6, respectively.

A second input terminal 5c of said AND gate 5 is connected with an output terminal 8b of an inverter 8 whose input terminal 8a is connected with a reset signal input terminal R; an input terminal 9a of an inverter 9 is connected with the output terminal 3b of said NAND gate 3 so that an output signal of said inverter 9 is fed to the next stage; and a first bit output terminal A is connected with the output terminal 6b of said NAND gate 6.

An initial unit stage 100 is composed of said NAND gates 1–4, said AND gate 5, said NAND gates 6 and 7, and said inverter 9.

A second unit stage 200 is composed of a first pair of NAND gates 201 consisting of 3-input NAND gates 10 and 11, first input terminals 10a and 11a and output terminals 10b and 11b of which, respectively, are cross-coupled; and a second pair of coincident gates 202 consisting of NAND gates 12 and 13, first input terminals 12a and 13a and output terminals 12b and 13b of which, respectively, are cross-coupled; with the output terminal 10b of said NAND gate 10 connected with a second input terminal 12c of said NAND gate 12, a second input terminal 13c of said NAND gate 13 connected with the output terminal 11b of said NAND gate 11, second input terminals 10c and 11c of said NAND gates 10 and 11 connected with the output terminals 13b and 12b of said NAND gates 13 and 12, respectively; and third input terminals 10d and 11d of said NAND gates 10 and 11 connected with an output terminal 9b of said inverter 9.

A third input terminal 13d of said NAND gate 13 is connected with an output terminal 8b of said inverter 8; an input terminal 14a of an inverter 14 for feeding trigger signals to the next stage is connected with the output terminal 10b of said NAND gate 10; and a second bit output terminal B is connected with the output terminal 12b of said NAND gate 12.

A third unit stage 300, consisting of 3-input NAND gates 15 and 16, a 2-input NAND gate 17, a 3-input NAND gate 18, and an inverter 19, and a fourth unit stage 400, consisting of 3-input NAND gates 20 and 21, a 2-input NAND gate 22, and a 3-input NAND gate 23, have the same configuration as that of said unit stage 200, except for the presence/absence of inverter for supplying trigger signals to the next stage.

Figure 2:
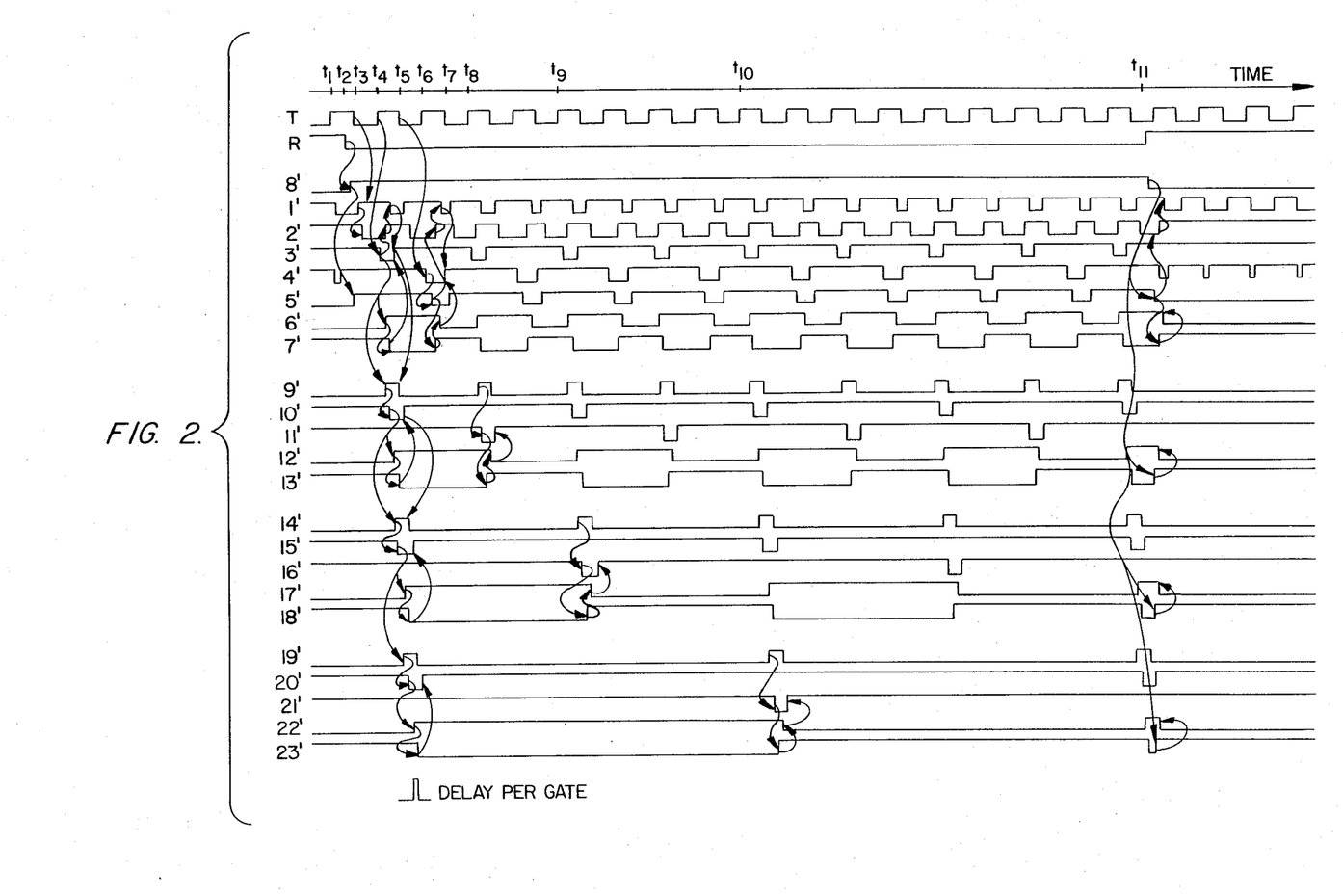
FIG. 2 is a signal waveform diagram of each part shown in FIG. 1.

When, in the circuit shown in FIG. 1, signals represented by T and R in FIG. 2 are applied to the trigger signal input terminal T and reset signal input terminal R, respectively, output signal waveforms of the logic gates 8, 1–7, 9–13, 14–18, and 19–23, are as shown by 8', 1'–7', 9'–13', 14'–18', and 19'–23' in FIG. 2, respectively.

Before a time $t_1$, if the level of said trigger signal input terminal T is 0 and the level of said reset signal input terminal R is 1, output levels of the NAND gates 1, 2, 3, 4, and 7, among the logic gates constituting the unit stage 100 are 1, while output levels of the AND gate 5, the NAND gate 6, and the inverter 9 are 0. Of the logic gates constituting the unit stage 200, output levels of the NAND gates 10, 11 and 13 are 1, while output levels of the NAND gate 12 and the inverter 14 are 0. Of the logic gates constituting the unit stage 300, output levels of the NAND gates 15, 16 and 18 are 1, while output levels of the NAND gate 17 and the inverter 19 are 0. Likewise, of the logic gates constituting the unit stage 400, output levels of the NAND gates 20, 21 and 23 are 1, while an output level of the NAND gate 22 is 0.

At time $t_1$, when the level of said trigger signal input terminal T changes to 1, the output levels of the NAND gates 1 and 4 changes to 0. However, as the output level of said NAND gate 1 changes to 0, the output level of said NAND gate 4 is immediately returns to 1. The output levels of the other logic gates do not change.

At a time $t_2$, when the level of said reset signal input terminal R changes to 0, reset stage is cancelled, changing the output level of the inverter 8 to 1, and subsequently changing the output level of the AND gate 5 to 1. The output level of the other logic gates do not change.

At a time $t_3$, when the level of said trigger signal input terminal T changes to 0, the output level of the NAND gate 1 changes to 1 subsequently, and the output level of the NAND gate 2 changes to 0. The output levels of the other logic gates do not change.

At a time $t_4$, when the level of said trigger signal input terminal T changes to 1 (or when the leading edge of the trigger signal arrives), the output level of the NAND gate 3 changes to 0, resulting in the change of the output levels of said NAND gates 2 and 6 and the inverter 9 into 1. When the output level of said NAND gate 2 changes to 1, the output level of said NAND gate 1 changes to 0, and when the output level of said NAND gate 6 changes to 1, the output level of the NAND gate 7 changes to 0, followed by the returning of the output level of said NAND gate 3 to 1.

On the other hand, when the output level of said inverter 9 changes to 1, the output level of the NAND gate 10 changes to 0, resulting in the change of the output level of the NAND gate 12 and the inverter 14 into 1. When the output level of said NAND gate 12 changes to 1, the output level of the NAND gate 13 changes 0, and subsequently the output level of said NAND gate 10 returns to 1. When the output level of said NAND gate 10 returns to 1, the output level of said inverter 9 has already changed to 0, which means that the output level of the NAND gate 11 does not change.

Further, when the level of said inverter 14 changes to 1, the output level of the NAND gate 15 changes to 0, and as a result the output levels of the NAND gate 17 and the inverter 19 change to 1. When the output level of said NAND gate 17 changes to 1, the output level of the NAND gate 18 changes to 0, which is followed by returning of the output level of the NAND gate 15 to 1. When the output level of said NAND gate 15 returns to 1, the output level of said inverter 14 has already been changed to 0 by said NAND gate 10. Therefore, the output level of the NAND gate 16 does not change at this time.

When the output level of said inverter 19 changes to 1, the output level of the NAND gate 20 changes to 0 subsequently, and as a result, the output level of the NAND gate 22 changes to 1. When the output level of said NAND gate 22 changes to 1, the output level of the NAND gate 23 changes to 0, followed by the returning of said NAND gate 20 to 1.

At a time $t_5$, when the level of the trigger signal input terminal T changes to 0 (or when the trailing edge of the trigger signal arrives), the output level of the NAND gate 1 changes to 1, followed by the change of the output level of the NAND gate 2 to 0. The output levels of the other logic gates do not change.

At a time $t_6$, when the leading edge of the trigger signal arrives, the output level of the NAND gate 4 changes to 0, followed by the output level of the AND gate 5 also changing to 0. As a result, the output level of the NAND gates 2 and 7 change to 1. When the output level of said NAND gate 2 changes to 1, the output level of the NAND gate 1 changes to 0, and when the output level of said NAND gate 7 changes to 1, the output level of the NAND gate 6 changes to 0, so that the output level of said NAND gate 4 returns to 1, followed by the returning of the output level of said AND gate 5 to 1.

At a time $t_7$, when the trailing edge of the trigger signal arrives, the output levels of the NAND gates 1 and 2 undergo the same change as at time $t_5$.

At a time $t_8$, the logic gates constituting the unit stage 100 operate in the same way as at time $t_4$, with the output level of the inverter 9 changing to 1.

When the output level of the inverter 9 changes to 1, the output level of the NAND gate 11 changes to 0, followed by the change in the output level of the NAND gate 13 to 1, which is then followed by the change in the output level of the NAND gate 12 to 0. As a result, the output level of said NAND gate 11 returns to 1. Since the output level of the NAND gate 10 does not change at this time, the output level of the inverter 14 does not change, with the output levels of the logic gates constituting the unit stages 300 and 400 retain the values which they have had up to that time.

At a time $t_9$, when the leading edge of the trigger signal arrives, the logic gates constituting the unit stages 100 and 200 operate in the same way as at time $t_4$, with the output level of the inverter 14 changing to 1.

When the output level of said inverter 14 changes to 1, the output level of the NAND gate 16 changes to 0, which is followed by the change in the output level of the NAND gate 18 to 1 and the change in the output level of the NAND gate 17 to 0. As a result, the output level of said NAND gate 16 returns to 1.

At a time $t_{10}$, when the leading edge of the trigger signal arrives, the logic gates constituting the unit stages 100, 200 and 300 operate in the same way as at time $t_4$, with the output level of the inverter 19 changing to 1.

When the output level of said inverter 19 changes to 1, the output level of the NAND gate 21 changes to 0, followed by the change in the output level of the NAND gate 23 to 1 and the change in the output level of the NAND gate 22 to 0. As a result, the output level of the NAND gate 21 returns to 1.

In this way, the binary counter shown in FIG. 1 decreases the value of its count output [DCBA] given at each bit output terminal one by one each time when a leading edge of the trigger signal is applied to the trigger signal input terminal T. When, at a time $t_{11}$, the level of the reset signal input terminal R changes to 1, with said count output retained at [1111], the output level of the inverter 8 changes to 0, followed by the change in the output level of THE AND gate 5 to 0, at which time the output levels of the NAND gate 13, the NAND gate 18 and the NAND gate 23 change to 1.

When the output level of said AND gate 5 changes to 0, the output levels of the NAND gate 2 and the NAND gate 7 change to 1 subsequently; and when the output level of said NAND gate 2 changes to 1, the output level of the NAND gate 1 changes to 0. When the output level of said NAND gate 7 changes to 1, the output level of the NAND gate 6 changes to 0.

Further, when the output level of said NAND gate 13 changes to 1, the output level of the NAND gate 12 changes to 0; when the output level of said NAND gate 18 changes to 1, the output level of the NAND gate 17 changes to 0; and when the output level of said NAND gate 23 changes to 1, the output level of the NAND gate 22 changes to 0. As a result, the counter output turns to [0000], thereby completing resetting.

Even if the level of the reset signal input terminal R is held at 1, the output level of the NAND gate 4 changes to 0 at the leading edge of the trigger signal. Since the output level of the NAND gate 7 is held at 1 during resetting, the change in the output level of said NAND gate 4 does not affect the other logic gates. However, in order to construct an up-counter by connecting the input terminals 9a, 14a and 19a of the inverters 9, 14 and 19 with the output terminals 4b, 11b and 16b of the NAND gates 4, 11 and 16, respectively, or in order to construct a presettable counter, it is necessary to hold the output level of said NAND gate 4 at 1, by applying reset or preset signals to the input terminal of said NAND gate 4.

Incidentally, in the circuit shown in FIG. 1, the first unit stage 100 has a construction which is different from those of the subsequent unit stages. Said unit stage 100 has the same function as that of the unit which is composed of an ordinary edge trigger type T flip-flop, to the output side of which a differentiation pulse generating circuit is added. Thus, a differentiation pulse output is fed from said unit stage 100 to the unit stage 200 As is obvious from FIG. 2, the pulse width of the output signal (differentiation pulse) of the inverter 9 equals to three times the signal delay per gate. On the other hand, the pulse width of the trigger signal applied to the input terminals 10d and 11d of the NAND gates 10 and 11 constituting the unit stage 200 is allowed to be equal to 4 times the signal delay per gate. Therefore, even when the signal delay of the logic gates constituting said unit stages 100 and 200 are all equal, a margin of the signal delay per gate is provided. This margin can be increased by making the operation speed of the logic gates constituting said unit stage 200 lower than the operation speed of the preceding stage (for example, this method is sometimes employed for I²L frequency dividing circuit for reducing power dissipation).

Since a differentiation pulse having the pulse width equivalent to three times the signal delay per gate of the logic gates constituting said unit stage 200 is fed to the third unit stage 300 via the inverter 14, said unit stage 300 also has a sufficient margin for normal counting operation.

The configuration of the first unit stage 100, as shown in FIG. 1, differs from those of the other unit stages, so that normal operation can be carried out even if the trigger signal for the first unit stage is a square wave signal. If the differentiation pulse is to be applied as a trigger signal, the configuration of the said unit stage 100 can be made the same as that of the subsequent unit stages.

As described above, the binary counter of this invention is featured by the configuration of the unit stages 200, 300 and 400 as shown in FIG. 1. Compared with conventional 6-gate flip-flops, the configuration of the binary counter of the invention is much simplified. In other words, the number of gates has been decreased. This is especially helpful for miniaturizing IC chip size and reducing power dissipation. In addition, the power for resetting each unit stage has been reduced to $\frac{1}{2}$-$\frac{1}{3}$ compared with conventional binary counters. This leads to the reduction of fan-out of the reset gate, which in turn enables high-speed resetting, and reduction in the number of elements constituting the reset gate of I²L.

If the same power dissipation as permitted for the conventional circuits is allowed for the binary counter of this invention, the follow-up frequency (operating frequency) of the counter can be increased than before.

More detailed description of what has been explained in the above paragraphs follows, with embodiments using CMOS and I²L.

Figure 3:
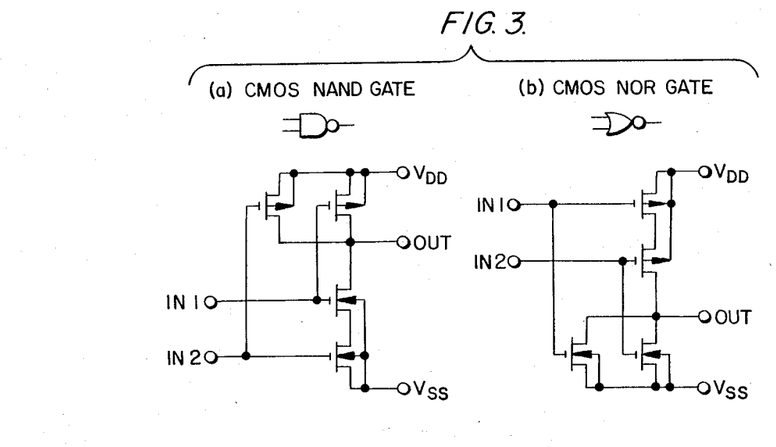
FIG. 3 is an equivalent circuit diagram of CMOS gate.
Figure 4:
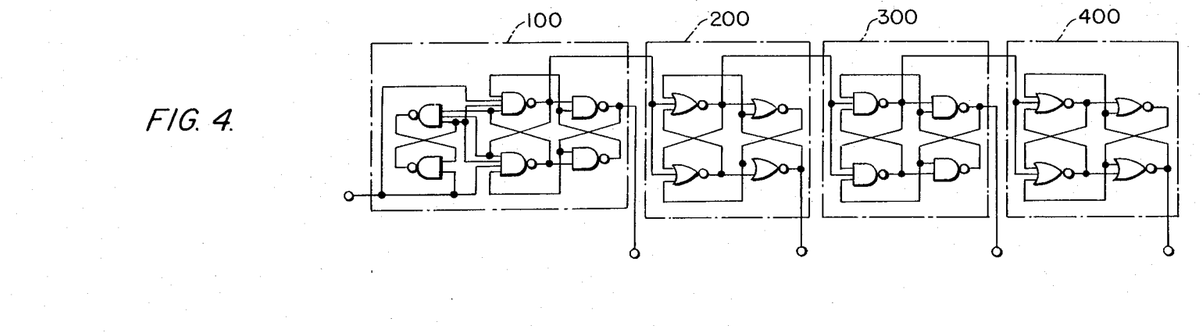
FIG. 4 is a logic diagram of another embodiment of a binary counter of the invention.

First, in CMOS, FIGS. 3(a) and (b) show equivalent circuit diagrams of CMOS gate, and FIG. 4 show a logic diagram of another embodiment of a binary counter of the invention. The number of elements constituting the NAND gate and that of the elements constituting the NOR gate are exactly the same, as shown in FIGS. 3(a) and (b). Therefore, as illustrated in FIG. 4, the construction of the first unit stage 100 and the third unit stage 300 with NAND gates and of the second unit stage 200 and the fourth unit stage 400 with NOR gates not only eliminates the necessity to use the inverters 9, 14 and 19 for connection between the unit stages, reducing the number of elements used, but also reduces signal delay between the stages to the signal delay corresponding to one gate, or half the signal delay of conventional counters. This allows operation of the counter up to higher frequency.

Figure 5:
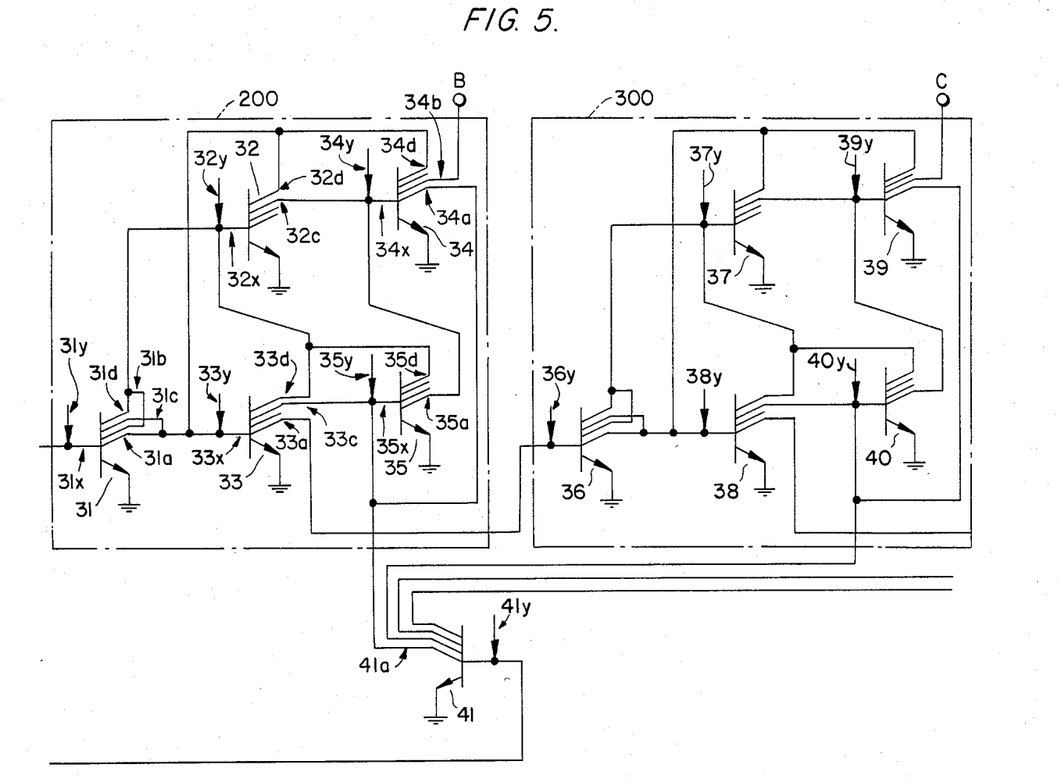
FIG. 5 and FIG. 6 are circuit diagram and element arrangement diagram of a binary counter of this invention using $I^2L$.
Figure 6:
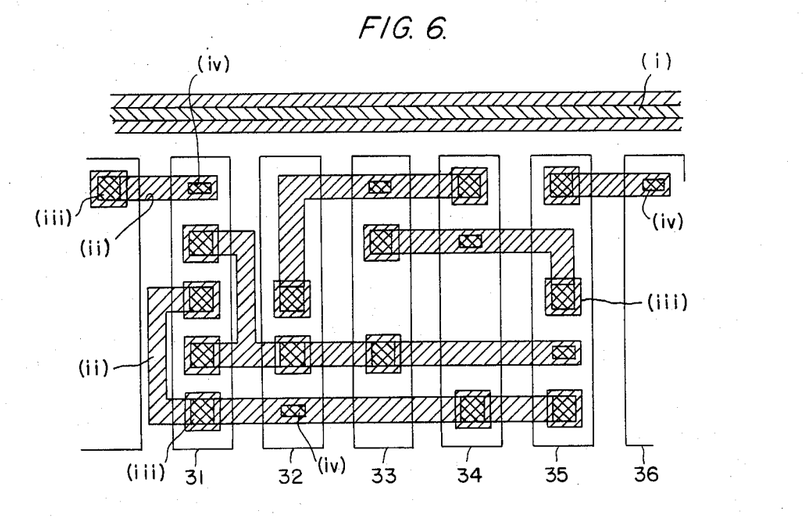

Next, in I²L, FIG. 5 and FIG. 6 show the specific circuit constructions and element arrangements inside IC of the unit stages 200 and 300 of I²L construction as shown in FIG. 1. Unlike the conventional unit stages which require 6 to 8 elements, the circuit of this invention can be constructed with five elements plus ¼ element for resetting. This not only reduces chip size, but also increases the injection current per element by 20%, if power dissipation per unit stage is allowed to reach the conventional level, thereby increasing the frequency limit to which the counter can be applied.

Incidentally, the counter of I²L construction, as shown in FIGS. 5 and 6, is constructed so as to increase the operating margin of each unit stage, making use of the phenomenon that a collector farther from the injector is subject to longer signal delay within a single element.

In FIG. 5, transistors 31–41 are all NPN transistors of multi-collector constituting the I²L gate. Arrows 31y–41y on base lines indicate injectors. A second collector 31b and a fourth collector 31d of said transistor 31 are commonly connected with a base 32x of the transistor 32; a first collector 31a and a third collector 31c of said transistor 31 are commonly connected with a base 33x of the transistor 33; a third collector 32c of said transistor 32 is connected with a base 34x of the transistor 34; and a third collector 33c of said transistor 33 is connected with a base 35x of the transistor 35. A fourth collector 33d of said transistor 33 and a fourth collector 35d of said transistor 35 are connected with the base 32x of said transistor 32; the fourth collector 32d of said transistor 32 and the fourth collector 34d of said transistor 34 are connected with the base 33x of said transistor 33; the first collector 35a of said transistor 35 is connected with the base 34x of said transistor 34; and the first collector 34a of said transistor 34 and the first collector 41a of the transistor 41 for resetting are connected with the base 35x of said transistor 35. The unit stage 200 is composed of said transistors 31, 32, 33, 34, and 35. The unit stages 300, 400, . . . have the same construction as that of the unit stage 200.

Figure 7:
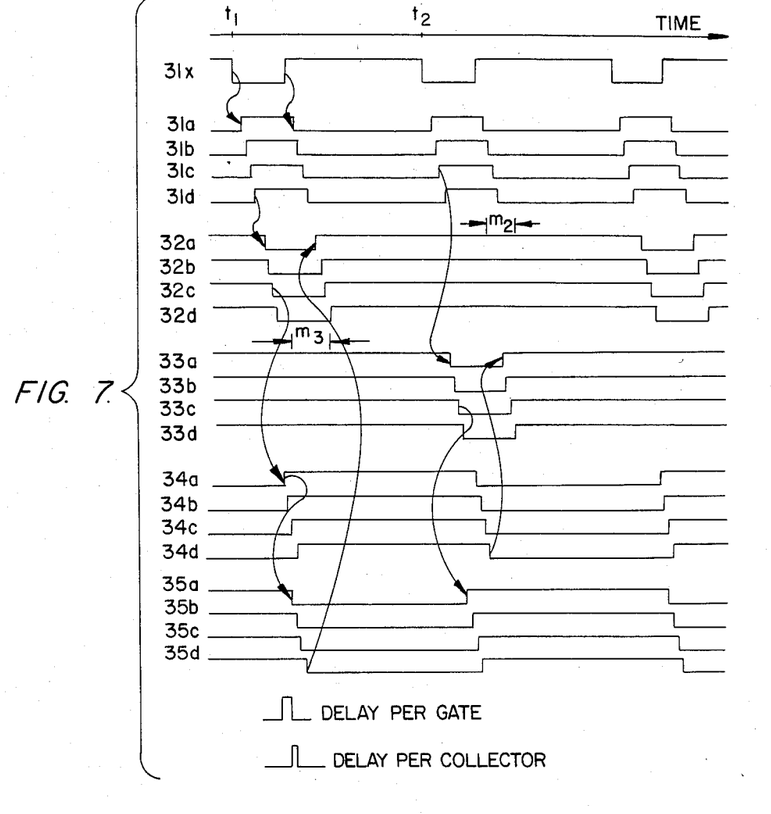
FIG. 7 is a signal waveform diagram of each transistor constituting an unit stage 200 shown in FIG. 5

FIG. 7 shows a signal waveform of each part of the circuit as shown in FIG. 5. An assumption is made that waveforms of the second, the third, and the fourth collectors of each transistor are delayed by ½ signal delay between gates from the waveforms of the first, the second and the third collectors.

In FIG. 7, $31a$–$31d$, $32a$–$32d$, $33a$–$33d$, $34a$–$34d$, and $35a$–$35d$ show signal waveforms of the first through the fourth collectors of the transistor 31, the first through the fourth collectors of the transistor 32, the first through the fourth collectors of the transistor 35, and the first through the fourth collectors of the transistor 35, respectively. Since, in an actual circuit, the first collector 31a and the third collector 31c of said transistor 31 are commonly connected with the fourth collectors 32d and 34d of said transistors 32 and 34, waveforms which are different from those shown in FIG. 7 appear. In order to simplify the explanation of operation, FIG. 7 shows the waveform of each collector as it is separated from the other collectors.

Now, when the level of a base 31x of said transistor 31 changes from 1 to 0 at time $t_1$ as shown in FIG. 7 while the output levels of the transistors 31 and 34 are 0 and the output levels of the transistors 32, 33, and 35 are 1 in FIG. 5, the level of the first collector 31a of said transistor 31 changes to 1, followed by consecutive change in the levels of the second, the third and the fourth collectors, 31b, 31c and 31d of said transistor 31 to 1.

When the level of the fourth collector 31d of said transistor 31 changes to 1, the level of the first collector 32a of the transistor 32 changes to 0, since the levels of the fourth collector 33d of the transistor 33 and the fourth collector 35d of the transistor 35 have already been 1. Then, the levels of the second, the third, and the fourth collectors 32b, 32c and 32d of the transistor 32 change to 0 consecutively.

When the level of the third collector 32c of said transistor 32 changes to 0, the level of the first collector 34a of the transistor 34 changes to 1, and the second, the third and the fourth collectors 34b, 34c and 34d of said transistor 34 change to 1, consecutively.

When the level of the first collector 34a of said transistor 34 changes to 1, if the level of the third collector 33c of the transistor 33 has already been made 1, and if no reset is applied, which means that the level of the first collector 41a of the transistor 41 is 1, the first collector 35a of the transistor 35 changes to 0. Then, the second, the third, and the fourth collectors 35b, 35c and 35d of said transistor 35 change to 0 consecutively.

When the level of the fourth collector 35d of said transistor 35 changes to 0, the level of the first collector 32a of said transistor 32 returns to 1, and then the second, the third and the fourth collectors 32b, 32c and 32d of said transistor 32 return to 1 consecutively.

Since the fourth collector 32d of said transistor 32 is connected with the base 33x of the transistor 33 if the levels of the first collector 31a and the third collector 31c of said transistor 31 are both 1 when the level of said fourth collector 32d is returned to 1, the output level of said transistor 33 changes to 0. The period from the time when the level of the first collector 31a of said transistor 31 changes to 0 to the time when the level of the fourth collector 32d of said transistor 32 returns to 1, has a margin equivalent to four times the signal delay per gate, as indicated by $m_3$ in FIG. 7.

The expansion of this margin is closely related to the connecting sequence of collectors of each transistor. By common connection of the first collector 31a of the first stage transistor 31 and the third collector (31c) of said transistor 31, a kind of waveform rectification is carried out between said first collector 31a and said third collector 31c, thereby applying to the base 32x an output pulse whose width is narrower than that of the input differentiation pulse. Thus the margin is increased all the more.

When the level of the base 31x of the transistor 31 changes to 0 to time $t_2$, the level of the first collector 31a of said transistor 31 changes to 1, which is followed by the consecutive change in the levels of the second, third and fourth collectors 31b, 31c and 31d of said transistor 31 to 1.

When the level of the third collector 31c of said transistor 31 changes to 1, the level of the first collector 33a of the transistor 33 changes to 0, followed by the consecutive change in the levels of the second, the third and the fourth collectors 33b, 33c and 33d of said transistor 33 to 0.

When the level of the third collector 33c of said transistor 33 changes to 0, the level of the first collector 35a of the transistor 35 changes to 1, followed by the consecutive change in the levels of the second, the third and the fourth collectors 35b, 35c and 35d of said transistor 35 to 1.

When the level of the first collector 35a of said transistor 35 changes to 1, the level of the first collector 34a of the transistor 34 changes to 0, followed by the consecutive change in the levels of the second, the third and the fourth collectors 34b, 34c and 34d of said transistor 34 to 0.

When the level of the fourth collector 34d of said transistor 34 changes to 0, the level of the first collector 33a of said transistor 33 returns to 1, followed by consecutive returning of the levels of the second, the third and the fourth collectors 33b, 33c and 33d of said transistor 33 to 1. At this time, there is a margin equivalent to three times the signal delay per gate, as indicated by $m_2$ in FIG. 7.

The element arrangement diagram shown in FIG. 6 is designed to meet actual needs, based on the consideration to increase operating margin. In FIG. 6, (i) indicates an injector contact rail, (ii) aluminum wire, (iii) collector contact hole, and (iv) base contact hole.

As is obvious from the foregoing description, the most remarkable feature of the binary counter of this invention is that a unit stage can be constructed by a smaller number of gates, as exemplified by the unit stage 200 as shown in FIG. 1 to form a logic construction which has undergone equivalent conversion. As a result, a lot of advantages can be obtained such as miniaturization of IC chip size, reduction of power dissipation, and higher limit of applicable frequency.

The unit stage 200 in FIG. 1 is composed of NAND gates, but can be composed of other coincident gates such as NOR gates, as has been described with reference to FIG. 4.

In the binary counter as shown in FIG. 1 or FIG. 5, a trigger pulse generated in the first unit stage is transmitted to the subsequent stages in a consecutive manner. If the number of stages is so many that transmission loss cannot be neglected, some consideration must be incorporated so that each unit stage shall have a function to stretch the trigger pulse.

Figure 8:
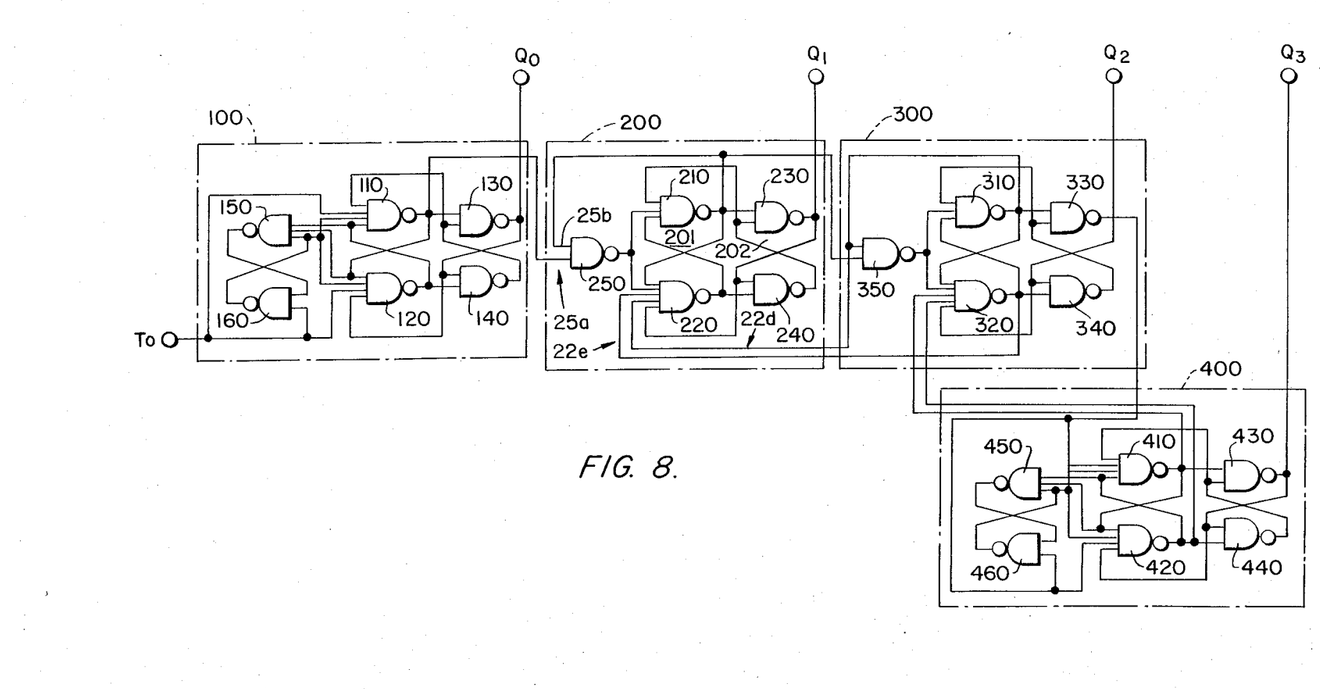
FIG. 8 is a logic diagram of a further embodiment of a binary counter of the invention.

FIG. 8 shows the improvement made in the construction of each unit stage for the above-mentioned purpose. A terminal $T_0$ is an input terminal to which clock signal is applied, and terminals $Q_0$, $Q_1$, $Q_2$ and $Q_3$ are count output terminals of the first, second, third and fourth bits.

In FIG. 8, the unit stage 100 of the first bit is composed of NAND gates 110, 120, 130, 140, 150 and 160. Said unit stage 100 is a unit stage to feed trigger signals to the unit stage 200 of the second bit, to which this invention is adapted. It has the same function as an ordinary T flip-flop circuit, to the output side of which a differentiation pulse generating circuit is added.

In said unit stage 200, a first pair of gates 201 is composed of NAND gates 210 and 220, one input terminal of each is cross-coupled with the other's output terminal; and a second pair of gates 202 is composed of NAND gates 230 and 240, one input terminal each is cross-coupled with the other's output terminal likewise.

The output terminals of said NAND gates 210 and 220 are connected with the other input terminals of said NAND gates 230 and 240; the second input terminals of said NAND gates 210 and 220 are connected with an output terminal of a NAND gate 250; and the third output terminals are connected with the output terminals of said NAND gates 240 and 230.

A first input terminal 25a of said NAND gate 250 is connected with an output terminal of the NAND gate 110 constituting the unit stage 100, second input terminal 25b is connected with the output terminal of said NAND gate 210; a fourth and a fifth input terminals 22d and 22e of said NAND gate 220 are connected with output terminals of NAND gates 310 and 320 constituting the next unit stage 300, respectively; and a first input terminal of a next NAND gate 350 is connected with the output terminal of said NAND gate 210.

The unit stage 300 is composed, as in the same way as the unit stage 200, of NAND gates 310, 320, 330, 340 and 350. The unit stage 400 is composed, as in the same way as the unit stage 100, of NAND gates 410, 420, 430, 440 and 450.

A fourth and a fifth input terminals of the NAND gate 320 constituting said unit stage 300 are connected with output terminals of the NAND gates 410 and 420 constituting said unit stage 400. An output signal of the NAND gate 330 is applied as a trigger signal to said unit stage 400.

The circuit as shown in FIG. 8 makes a great contribution to the reduction of the number of elements, especially when it is employed for $I^2L$. The outline of the operation shall be described in the following paragraphs, with reference to circuit connection diagrams consisting the unit stages 100 and 200 and $I^2L$ transistors.

Figure 9:
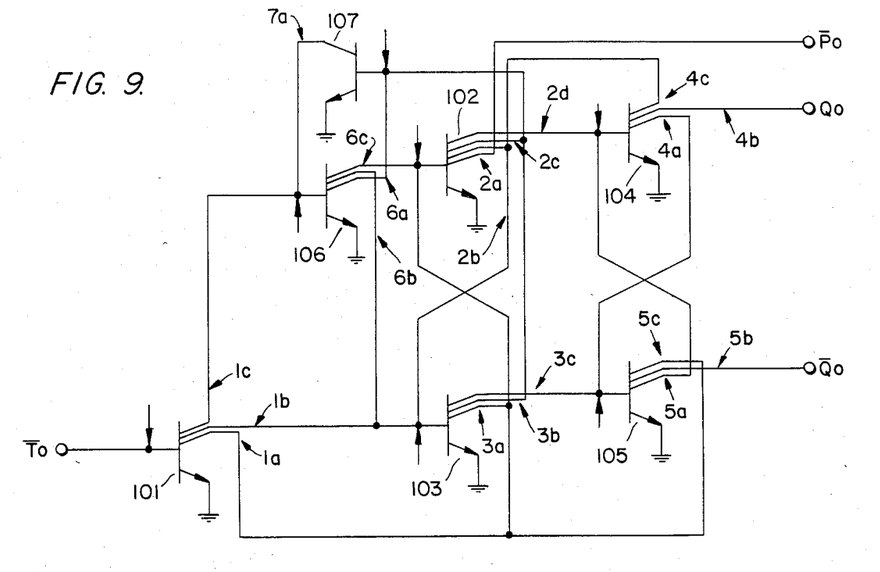
FIG. 9 is a circuit diagram of an unit stage 100 shown in FIG. 8, constructed with the use of $I^2L$ transistors.

FIG. 9 is a circuit connection diagram showing a logic construction of the unit stage 100 shown in FIG. 8, which is materialized with the use of $I^2L$ circuit. In FIG. 9, a base of a transistor 101 is connected with a clock pulse input terminal $\overline{T_0}$; a first collector 1a of the same transistor is connected with a base of a transistor 102; a second collector 1b of the same transistor is connected with a base of a transistor 103; and a third collector 1c of the same transistor is connected with a transistor 106. A first collector 2a of the transistor 102 is connected with a driving output terminal $\overline{P_0}$; a second collector 2b of the same transistor is connected with the base of said transistor 103; a third collector 2c of the same transistor is connected with a base of a transistor 107; and a fourth collector 2d of the transistor is connected with a base of a transistor 104. A first collector 3a of said transistor 103 is connected with the base of said transistor 102; a second collector 3b of the same transistor is connected with the base of said transistor 107; and a third collector 3c of the same transistor is connected with a base of a transistor 105.

A first collector 4a of said transistor 104 is connected with the base of said transistor 105, a second collector 4b of the same transistor is connected with an output terminal $\overline{Q_0}$ of the first bit; and a third collector 4c of the same transistor is connected with the base of said transistor 103. A first collector 5a of said transistor 105 is connected with the base of said transistor 104; a second collector 5b of the same transistor is connected with an inverted output terminal $Q_0$ of the first bit; and the third collector 5c of the same transistor is connected with the base of said transistor 102.

A first collector 6a of said transistor 106 is connected with the base of said transistor 107, a second collector 6b of the same transistor is connected with the base of said transistor 103; and a third collector 6c of the same transistor is connected with the base of said transistor 102. A first collector 7a of said transistor 107 is connected with the base of said transistor 106.

Figure 10:
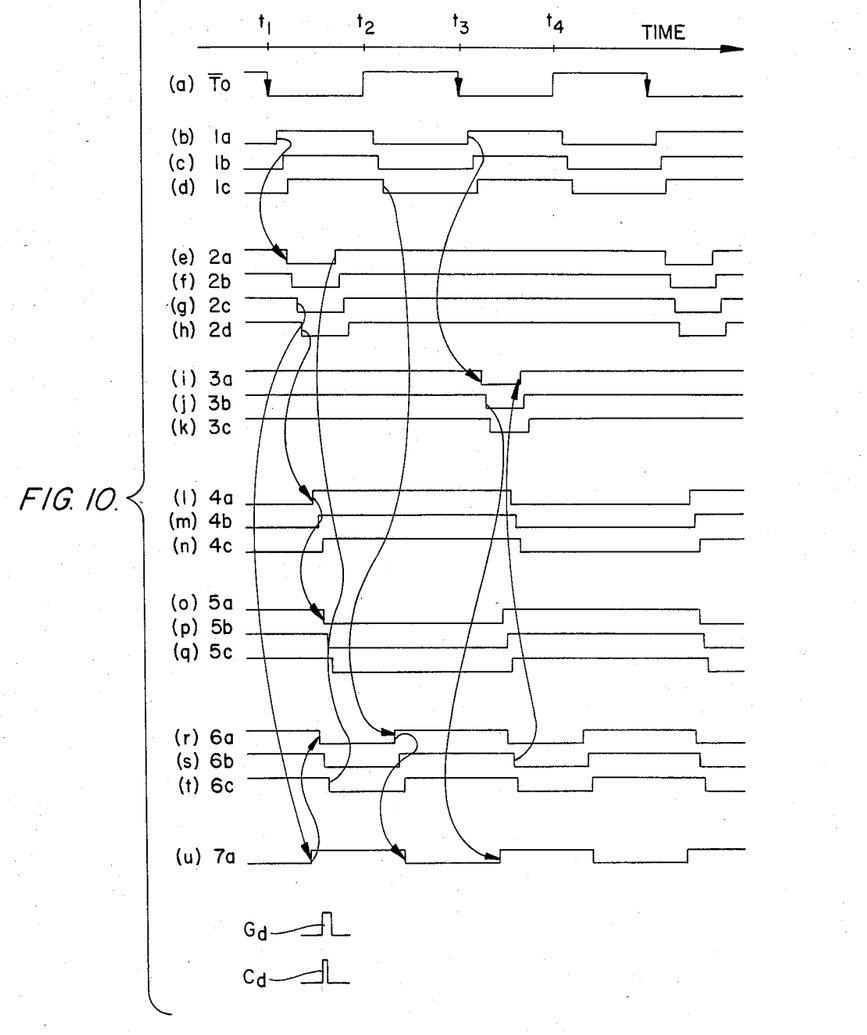
FIG. 10 is a signal waveform diagram of each part shown in FIG. 9.

FIG. 10 shows a signal waveform of each part of the circuit shown in FIG. 9. An assumption is made that signal waveforms of the second, the third and the fourth collectors of each transistor are delayed by the length of time equivalent to half a signal delay per gate, from the waveforms of the first, the second and the third collectors. In FIG. 10, (a) indicates the clock pulse to be inputted to the clock pulse input terminal $\overline{T_0}$, and (b)-(d), (e)-(h), (i)-(k), (l)-(n), (o)-(q), (r)-(t), and (u) show signal waveforms of the first through the third collectors of the transistor 101, the first through the fourth collectors of the transistor 102, the first through the third collectors of the transistor 103, the first through the third collectors of the transistor 104, the first through the third collectors of the transistor 105, the first through the third collectors of the transistor 106, and the first collector of the transistor 107. In actual circuit, the first collector 1a of said transistor 101, for example, is commonly connected with the collectors 3a, 5c and 6c of said transistors 103, 105, and 106, respectively, signal waveform that is different from the one shown in FIG. 10 appears. For the purpose of simplifying the explanation of operation, FIG. 10 shows the waveform of each collector as it is separated from the other collectors. In FIG. 10, $G_d$ indicates a delay per gate, and $C_d$ indicates a delay per collector.

When the level of the base of said transistor 101 changes from 1 to 0, as shown in FIG. 10 (a), at a time $t_1$, while the output levels of the transistors 101, 104 and 107 as shown in FIG. 9 are 0 and the output levels of the transistors 102, 103, 105 and 106 are 1, the level of the first collector 1a of said transistor 101 changes to 1, followed by consecutive change in the levels of the second collector 1b and the third collector 1c of the same transistor to 1.

When the level of the first collector 1a of said transistor 101 changes to 1, the level of the first collector 2a of the transistor 102 changes to 0 levels of the first collector 3a of the transistor 103, the third collector 5c of the transistor 105 and the third collector 6c of the transistor 106 are all 1. Further, the second collector 2b, the third collector 2c, and the fourth collector 2d of the same transistor change to 0 consecutively.

When the level of the third collector 2c of said transistor 102 changes to 0, the output level of the first collector 7a of the transistor 107 changes to 1, at which time, since the level of the third collector 1c of said transistor 101 is 1, the level of the first collector 6a of the transistor 106 changes to 0, followed by consecutive change in the levels of the second collector 6b and the third collector 6c of the same transistor to 0.

When the level of the third collector 6c of said transistor 106 changes to 0, the level of the first collector 2a of said transistor 102 returns to 1, followed by consecutive returning of the levels of the second collector 2b, the third collector 2c, and the fourth collector 2d of the same transistor to 1.

Meanwhile, when the level of the fourth collector 2d of said transistor 102 changes from 1 to 0 before returning to 1, the level of the first collector 4a of the transistor 104 changes to 1, followed by subsequent change in the levels of the second collector 4b and the third collector 4c of the same transistor to 1.

When the level of the first collector 4a of said transistor 104 changes to 1, the level of the first collector 5a of the transistor 105 changes to 0, since the level of the third collector 3c of the transistor 103 has already been 1. This is followed by consecutive change in the levels of the second collector 5b and the third collector 5c of the same transistor to 0.

When, at a time $t_2$, the level of the base of said transistor 101 changes to 1, the level of the first collector 1a of said transistor 101 changes to 0, followed by consecutive change in the levels of the second collector 1b and the third collector 1c of the same transistor to 0.

When the level of the third collector 1c of said transistor 101 changes to 0, the levels of the first collector 6a, the second collector 6b and the third collector 6c of the transistor 106 change to 1, consecutively. When the level of the first collector 6a of said transistor 106 changes to 1, the level of the first collector 7a of the transistor 107 changes to 0, to get ready for the arrival of the leading edge of the clock pulse at a time t.

When, at the time $t_3$, the level of the base of the transistor 101 changes to 0, the levels of the first through the third collectors of the same transistor change to 1.

When the level of the second collector 1b of said transistor 101 changes to 1, the level of the first collector 3a of the transistor 103 changes to 0, since the second collector 2b of the transistor 102, the third collector 4c of the transistor 104, and the second collector 6b of the transistor 106 are all 1. This is followed by the change in the levels of the second collector 3b and the third collector 3c of the same transistor to 0.

When the output level of the second collector 3b of said transistor 103 changes to 0, the level of the first collector 7a of the transistor 107 changes to 1; and when the output level of the third collector 3c of said transistor 103 changes to 0, the level of the first collector 5a of the transistor 105 changes to 1.

When the level of the first collector 7a of said transistor 107 changes to 1, the level of the first collector 6a of the transistor 106 changes to 0, followed by the change in the levels of the second collector 6b and the third collector 6c of the same transistor to 0. When the level of the second collector 6b of said transistor 106 changes to 0, the level of the first collector 3a of said transistor 103 returns to 1.

During this time, the output level of the transistor 104 changes to 0, as the level of the first collector 5a of said transistor 105 changes to 1.

When, at a time $t_4$, the level of the base of the transistor 101 changes to 1, the output level of said transistor 101 changes to 1, as in the same way as at the time $t_2$. As a result, the output level of the transistor 106 changes to 1 and the output level of the transistor 107 changes to 0.

Thereafter, the output level of each transistor repeats change each time when the level of the base of said transistor 101 changes, or in other words, each time when the level of the clock pulse input terminal $\overline{T}_0$ changes. When the level of the clock pulse input terminal $\overline{T}_0$ of the circuit shown in FIG. 9 undergoes a change as shown in FIG. 10 (a), the signal waveforms indicated by (e), (m) and (p) in FIG. 10 appear at the driving output terminal $\overline{P}_0$, the output terminal of the first bit $Q_0$, and the inverted output terminal of the first bit $\overline{Q}_0$, respectively.

To sum up, the circuit shown in FIG. 9 can be regarded as an ordinary T flip-flop circuit with the addition of the function of a differentiation pulse generating circuit.

Figures 11, 14:
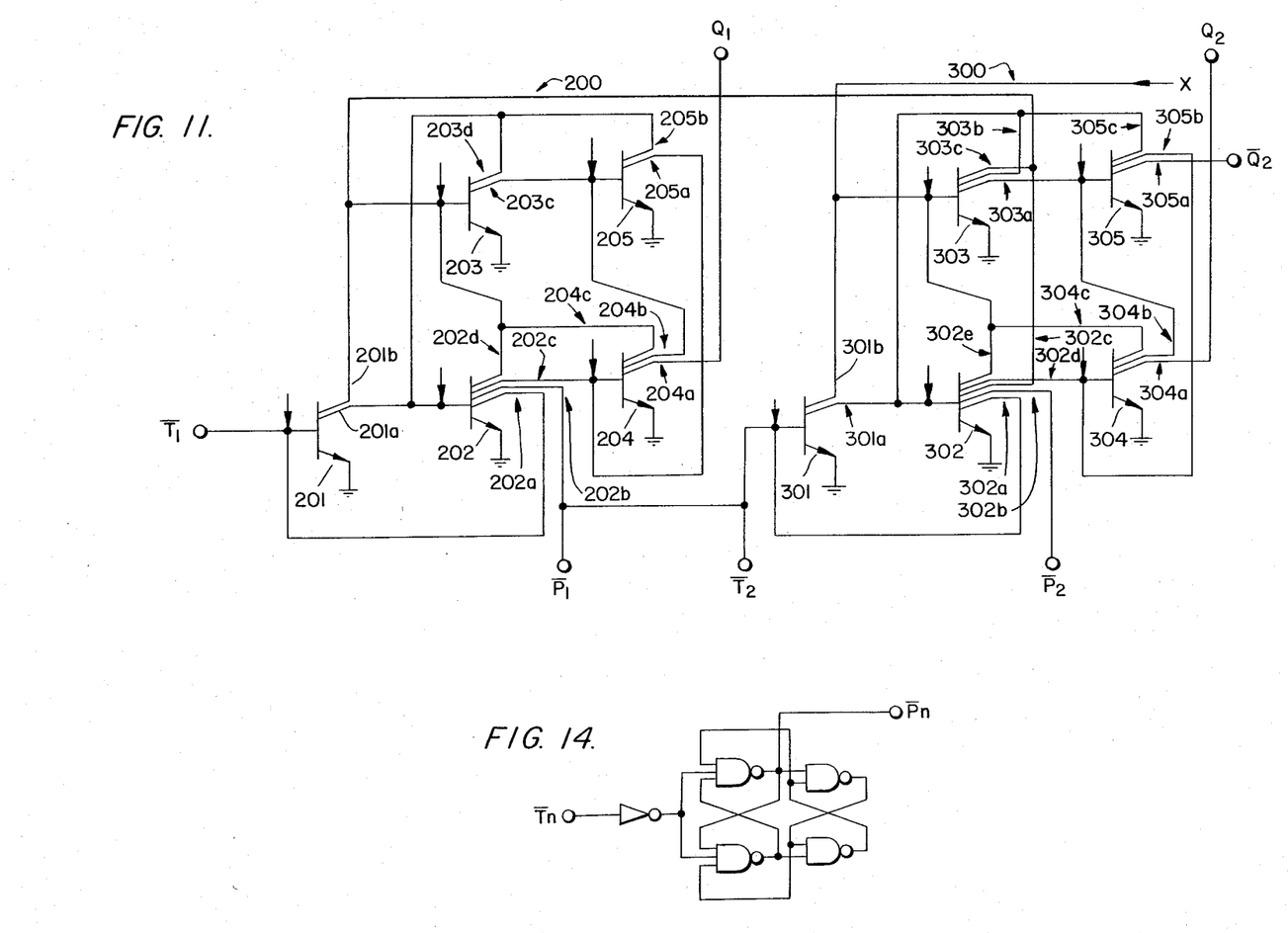
FIG. 11 is a circuit diagram of unit stages 200 and 300 shown in FIG. 8, constructed with the use of $I^2L$ transistors.
FIG. 14 is a logic diagram, showing another construction of a unit stage.

FIG. 11 is a circuit connection diagram of logic constructions of the unit stages 200 and 300 shown in FIG. 8, which are materialized with the use of I²L circuit. In FIG. 11, a first collector 201a of a transistor 201, whose base is connected with a trigger signal input terminal $\overline{T}_1$, is connected with a base of a transistor 202; and a second collector 201b of the same transistor is connected with a base of a transistor 203. A first collector 202a of said transistor 202 is connected with a base of said transistor 201; a second collector 202b of said transistor is connected with a driving output terminal $P_1$; a third collector 202c of the same transistor is connected with a base of a transistor 204; a fourth collector 202d of the same transistor is connected with the base of said transistor 203; a third collector 203c of said transistor 203 is connected with a base of the transistor 205; and a fourth collector 203d of the same transistor 203 is connected with the base of said transistor 202.

A first collector 204a of said transistor 204 is connected with an output terminal $Q_1$ of the second bit; a second collector 204b of the same transistor is connected with the base of said transistor 205; and the third collector 204c of the same transistor is connected with the base of said transistor 203. A first collector 205a of said transistor 205 is connected with the base of said transistor 204; and a second collector 205b of the same transistor is connected with the base of said transistor 202.

The unit stage 300 is composed of transistors 301, 302, 303, 304 and 305, which are mutually connected with one another in the same way as the unit stage 200. It must be noted, however, that third collectors 302c and 303c of the transistors 302 and 303, respectively, are commonly connected, and further connected with the base of said transistor 203 (unit stage 200).

This is equivalent to the way the fourth and fifth input terminals of the NAND gate 22 are connected with the output terminals of the NAND gates 31 and 32 of the next stage as shown in FIG. 8.

In FIG. 11, the driving output terminal $\overline{P}_1$ of the second bit is connected with the trigger signal input terminal of the third bit; and, although not shown in the drawings, an output terminal $\overline{Q}_2$ of the second bit shall be connected with an input terminal $\overline{T}_3$ of the third bit of the circuit which is the same as the one shown in FIG. 9, and the collectors of transistors equivalent to transistors 102 and 103 shown in FIG. 9 shall be connected with a x rail with which a base of the transistor 303 is connected.

If, however, the counter does not have a 4-bit construction and has a larger number of bits, the circuit of the same construction as the unit stage 300 shown in FIG. 11 is employed in a repetitive manner, with a driving output terminal $\overline{P}_2$ connected with a trigger signal input terminal of the next stage. Only MSB shall have a different construction (for example, the same circuit construction as shown in FIG. 9).

Figure 12:
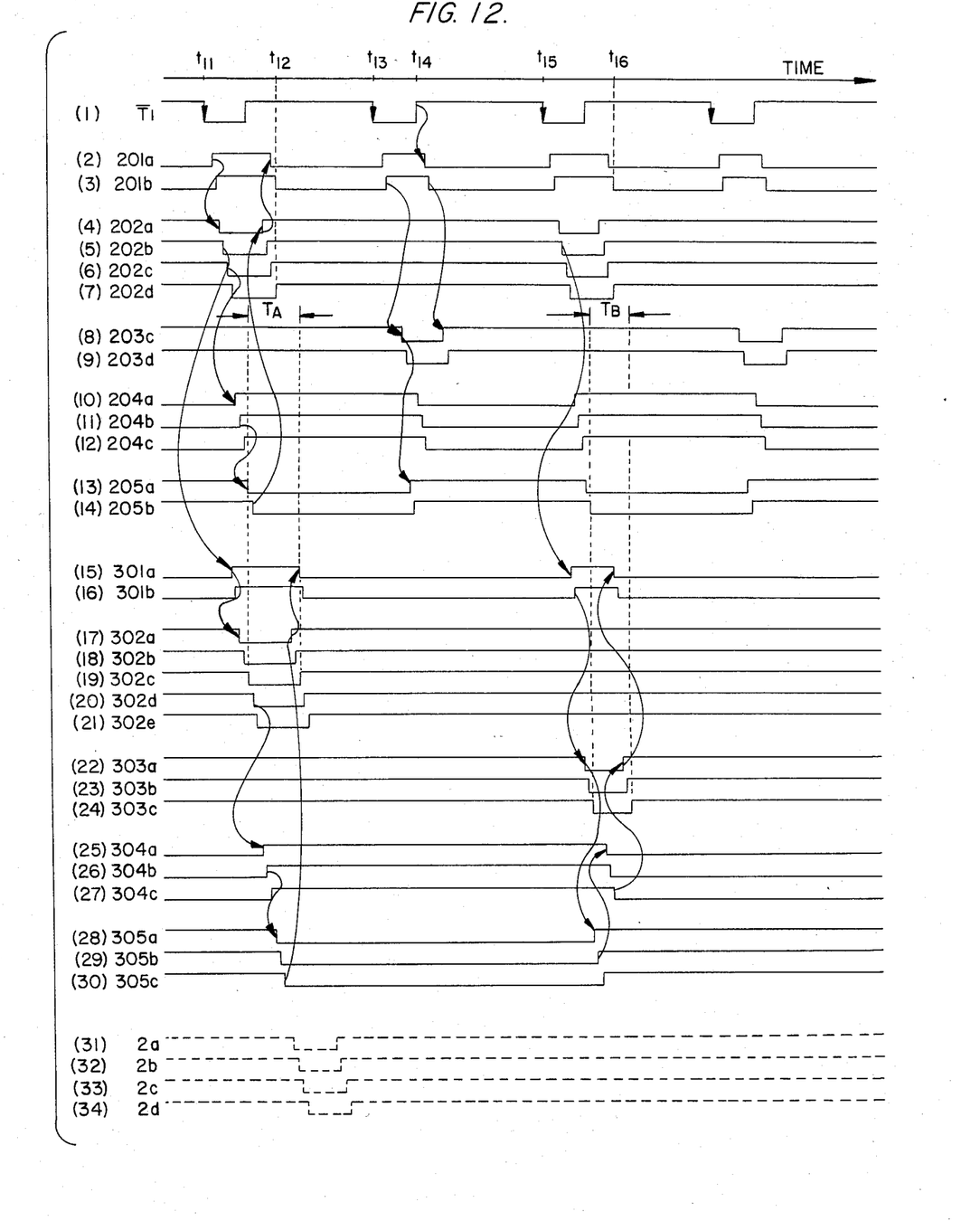
FIG. 12 is a signal waveform diagram of each part shown in FIG. 11.

What follows is the description of the operation of the circuitry shown in FIG. 11, with reference to signal waveforms (1)–(34) in FIG. 12.

When, at a time $t_{11}$, the base level of said transistor 201 changes from 1 to 0, as shown in FIG. 12, (1), while the output levels of the transistors 201, 204, 301 and 304 in FIG. 11 are 0 and the output levels of the other transistors are 1, the first collector 201a of said transistor 201 and then the second collector 201b of the same transistor change to 1.

When the level of the first collector 201a of said transistor 201 changes to 1, the level of the first collector 202a of the transistor 202 changes to 0, since the levels of the fourth collector 203d of the transistor 203 and the second collector 205b of the transistor 205 are both 1, followed by consecutive change in the levels of the second collector 202b, the third collector 202c, and the fourth collector 202d of the same transistor to 0.

When the level of the third collector 202c of said transistor 202 changes to 0, the level of the first collector 204a of the transistor 204 changes to 1 subsequently, followed by consecutive change in the levels of the second collector 204b and the third collector 204c of the same transistor to 1.

When the level of the second collector 204b of said transistor 204 changes to 1, the level of the first collector 205a of the transistor 205 changes to 0, since the level of the third collector 203c of the transistor 203 has already been 1, followed by the change in the level of the second collector 205b of the same transistor to 0.

When the level of the second collector 205b of said transistor 205 changes to 0, the output level of said transistor 202 returns to 1, followed by consecutive returning of the levels of the first collector 202a, the second collector 202b, the third collector 202c and the fourth collector 202d of the same transistor to 1.

If, at the time when the level of the first collector 202a of said transistor 202 returns to 1, the level of the trigger signal input terminal $T_1$ has changed to 1, the levels of the first collector 201a and the second collector 201b of the transistor 201 changes to 0 consecutively.

Immediately after the time $t_{11}$, the level of the second collector 202b of the transistor 202 changes from 1 to 0. Due to this change, the levels of the first collector 301a and the second collector 301b of the transistor 301 change to 1 consecutively. When the level of the first collector 301a of said transistor 301 changes to 1, the levels of the first collector 302a, the second collector 302b, the third collector 302c, the fourth collector 302d, and the fifth collector 302e of the transistor 302 change to 0 consecutively.

When the level of the fourth collector 302d of said transistor 302 changes to 0, the level of the first collector 304a of the transistor 304 changes to 1, with the levels of the second collector 304b and the third collector 304c of the same transistor consecutively changing to 1.

When the level of the second collector 304b of said transistor 304 changes to 1, the levels of the first collector 305a, the second collector 305b and the third collector 305c of the transistor 305 change to 0 consecutively. Due to the change in the level of the third collector 305c of said transistor 305 to 0, the output level of said transistor 302 returns to 1, with the output level of said transistor 301 changing to 0.

At a time $t_{12}$ in FIG. 12, the timing at which the level of the fourth collector 202d of the transistor 202 returns to 1 coincides with the timing at which the level of the second collector 201b of the transistor 201 returns to 1. It is anticipated, however, that a slight delay could be caused to the timing at which the output level of said transistor 201 changes to 0 due to wiring capacity, delicate variation in the transistor characteristics, etc.

Accordingly, if the output of the transistors 302 and 303 constituting the next unit stage 300 is not applied to the base of the transistor 203, the output level of said transistor 203 may accidentally change to 0 (wrong operation) immediately after the output level of said transistor 202 changes to 1. However, such a wrong operation is impossible in FIG. 11, since changing of the output level of said transistor 203 to 0 is prohibited during the period indicated by $T_A$ around the time $t_{12}$, that is the period during which the level of the third collector 302c of said transistor 302 remains 0.

Wrong operation of said transistor 303 can be prohibited by applying the output of the circuit of the next stage (here, the output of the transistors 102 and 103, since the circuit of the next stage is of the same construction as the one shown in FIG. 9) also to the base of the transistor 303 constituting the unit stage 300. (The signal waveforms indicated by broken lines in FIG. 12 are signal waveform that appear at the first collector 2a, the second collector 2b, the third collector 2c and the fourth collector 2d of the transistor 102 constituting the next unit stage 400.)

In the unit stage 200, the connection of the first collector 202a of the transistor 202 with the base of the transistor 201 forms a circuit to cause the above-mentioned wrong operation. (Due to said connection, the output level of the transistor 201 changes to 0 after the output level of the transistor 202 returns to 1.) However, said connection is conceived for other reasons. An output signal which appear in the second collector 202b of said transistor 202 is fed to the next stage as a driving signal. If said connection is not made, both the leading edge and the trailing edge of the output signal of said transistor 202 get constrained by the leading edge and the trailing edge of the input trigger signal, making it impossible to feed a driving signal whose pulse width is wider than that of the input trigger signal, to the next stage.

Under such circumstances, the pulse width gradually becomes narrower and eventually disappears due to wiring capacity and loading capacity, as the trigger signal is propagated from one unit stage to another.

In the circuit shown in FIG. 11, let the description be limited to the unit stage 200. By connecting the first collector 202a to the base of the transistor 201, the trailing edge of the driving signal to be fed to the next stage is at least prevented from being constrained by the trailing edge of the input trigger signal, and is made to depend on the signal delay of each transistor within the unit stage. To put it differently, even if the pulse width of the input trigger signal has become extremely narrow, the trigger signal does not fade out, since the function to widen the pulse width within the unit stage and to feed the signal to the next stage is incorporated.

When, at a time $t_{13}$, the leading edge of the input trigger signal arrives and the level of the base of the transistor 201 changes to 0, the levels of first collector 201a and the second collector 201b of said transistor 201 change to 1. Since at this time all the levels of the fourth collector 202d of the transistor 202, the third collector 204c of the transistor 204, the third collector 302c of the transistor 302, and the third collector of the transistor 303 are 1, the output level of the transistor 203 changes to 0, with the levels of the third collector 203c, and the fourth collector 203d of the same transistor changing to 0 consecutively. (The first and the second collectors of said transistor 203 are not used here.)

When the level of the third collector 203c of said transistor 203 changes to 0, the output level of the transistor 205 changes to 1, which is followed by the change in the output level of the transistor 204 to 0.

When, at a time $t_{14}$, the trailing edge of the input trigger signal arrives, the output level of the transistor 201 changes to 0 and the level of the second collector 201b of the same transistor changes to 0, which results in the change in the output level of the transistor 203 to 1.

Since the level of the first collector 201a of said transistor 201 has changed to 0 before the level of the second collector 203b of said transistor 203 changes to 1, no wrong operation cannot be caused at this point in time, by the change in the output level of the transistor 202 to 0.

When, at a time $t_{15}$, the leading edge of the input trigger signal arrives, the unit stage 200 operates in the same way as at the time $t_{11}$, with the transistor 202 feeding a driving signal to the next unit stage 300.

When the level of the second collector 202b of said transistor 202 changes to 0, the output level of the transistor changes to 1, which is followed by the change in the output level of the transistor 303 to 0. Furthermore, the output level of the transistor 305 changes to 1, resulting in the change in the output level of the transistor 304 to 0.

When the level of the third collector 304c of said transistor 304 changes to 0, the output level of said transistor returns to 1, and the output level of said transistor 301 changes to 0, completing the series of operation.

Simultaneously with the change in the level of the second collector 201b of the transistor 201 to 0 at a time $t_{16}$, the level of the fourth collector 202d of the transistor 202 changes to 1. Even in this case, the unit stage 200 does not operate wrongly, since during the period $T_B$ change in the output level of the transistor 203 is prohibited by the transistor 303.

Figure 13:
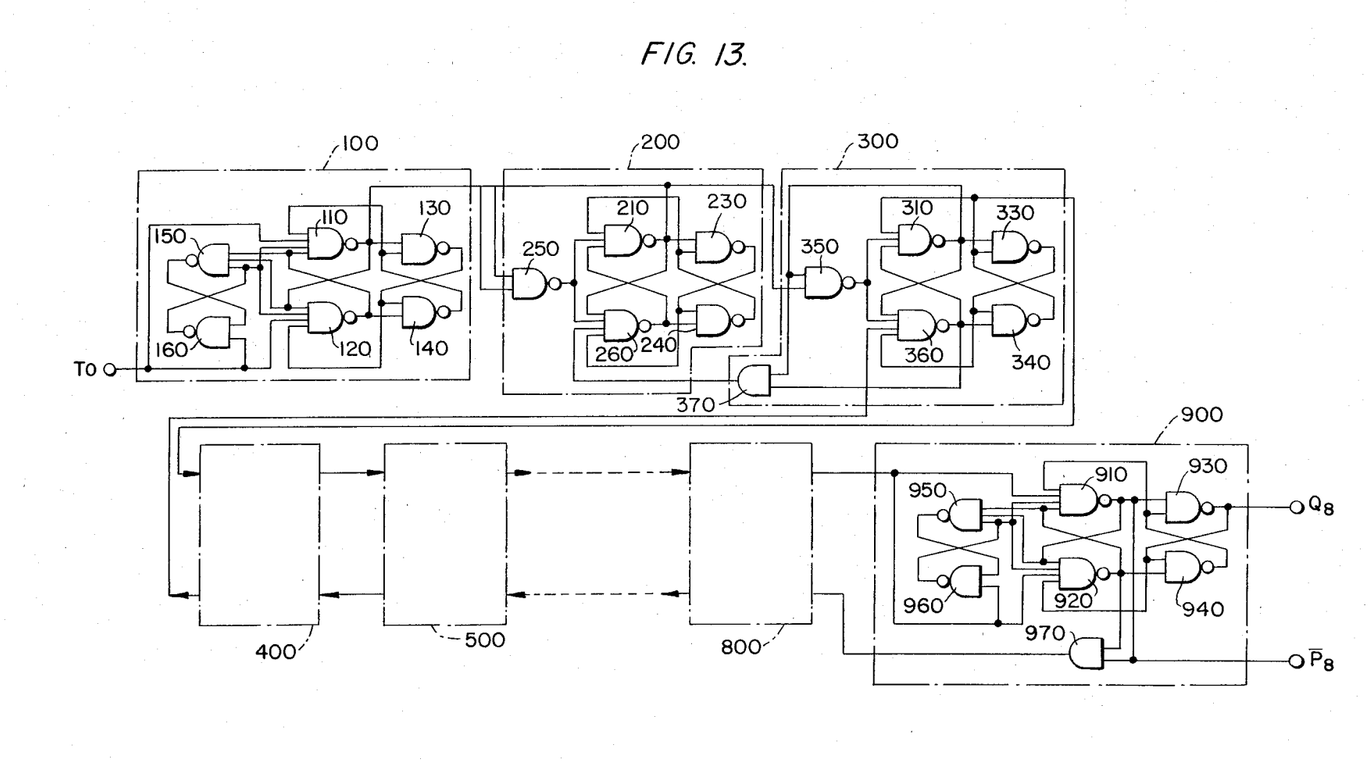
FIG. 13 is a logic diagram of still another embodiment of the invention.

The binary counter of this invention is capable of equivalent conversion and omission of various kinds in case of need. For example, FIG. 13 shows the application of this invention to a frequency divider. Bit output terminals $Q_0$, $Q_1$, $Q_2$, ... as shown in FIG. 8 are omitted; the 5-input NAND gate 220 is substituted by a 4-input NAND gate 260; and a AND gate 370 is added to the next stage.

In FIG. 13, unit stages 400, 500, ..., 800 are of the same construction as the unit stage 300. Since it is quite unlikely that the trigger signal generated in the unit stage 300 fades out on an input side of the unit stage 400, it is possible to apply this invention to the unit stages 500 and 700 only, and to construct the remaining unit stages more simply, as shown in FIG. 14.

By the same reason, the MSB need not have the same construction as that of a unit stage 900 shown in FIG. 13. If no trigger signal is extracted for application to other circuits, the construction of MSB as shown in FIG. 14 will do.

In case of need, it is possible to add the reset and preset functions of each unit stage.

For example, the unit stages 200 and 300 can be reset by connecting a collector of a resetting transistor (not shown in the figure) to the bases of the transistor 205 and 305. Presetting to [1,1] can be made by connecting a collector of a presetting transistor (not shown in the figure) to the bases of the transistors 204 and 304.

Although both NAND and AND gates are used in the logic construction diagrams shown in FIG. 8 and FIG. 13, the other coincident gates such as NOR gates and OR gates can be employed.

As has been described so far, since the binary counter of this invention is composed of the first pair of coincident gates consisting of the first and second coincident gates, the first input terminal of each is cross-coupled with the other's output terminal, and the second pair of coincident gates consisting of the third and fourth coincident gates, and the first input of each is cross-coupled with the other's output terminal; with its unit stage constructed so that the output signal of said first coincidence gate is applied to the second input terminal of said third coincidence gate, the output signal of said second coincidence gate is applied to the second input terminal of said fourth coincidence gate, the output signal of said second coincidence gate is applied to the second input terminals of said first and second coincidence gates, the output signal of said second pair of coincidence gates is applied to the second input terminals of said first and second coincidence gates, and trigger signal is applied to the third input terminals of said first and second coincidence gates; the output signal of said first pair of coincidence gates being fed to the next unit stage as a trigger signal, the number of logic gates constituting a unit stage can be reduced, which in turn makes great contributions to the miniaturization of IC chip size, reduction of power dissipation, and raising the applicable frequency limit.

What is claimed is:

1. A binary counter, a unit stage thereof comprising:

a first pair of coincidence gates consisting of a first and a second coincidence gates, a first input terminal of each gate being cross-coupled with the other's output terminal;

a second pair of coincidence gates consisting of a third and a fourth coincidence gates, a first input terminal of each gate being cross-coupled with the other's output terminal;

a fifth coincidence gate, an output terminal thereof being coupled with second input terminals of said first and said second coincidence gates;

means for supplying an output signal of said first coincidence gate to a second input terminal of said third coincidence gate;

means for supplying an output signal of said second coincidence gate to a second input terminal of said fourth coincidence gate;

means for supplying an output signal of said second pair of coincidence gates to third input terminals of said first and said second coincidence gates;

means for supplying a trigger signal from a preceding unit stage to a first input terminal of said fifth coincidence gate;

means for supplying the output signal of said first coincidence gate to a second input terminal of said fifth coincidence gate;

means for supplying, as a trigger signal, the output signal of said first coincidence gate to a next unit stage; and means for supplying output signals of a next first and a next second coincidence gates which constitute the next unit stage to a fourth and a fifth input terminals of said second coincidence gate, respectively.

2. A binary counter as claimed in claim 1, wherein the third input terminal of said first coincidence gate is connected with the output terminal of said fourth coincidence gate; and the third input terminal of said second coincidence gate is connected with the output terminal of said third coincidence gate.

* * * * *